(12) United States Patent
Jeong

(10) Patent No.: US 6,961,274 B2
(45) Date of Patent: Nov. 1, 2005

(54) SENSE AMPLIFIER

(75) Inventor: Jong Bae Jeong, Ichon-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 54 days.

(21) Appl. No.: 10/601,868

(22) Filed: Jun. 24, 2003

(65) Prior Publication Data

US 2004/0004868 A1 Jan. 8, 2004

(30) Foreign Application Priority Data

Jul. 8, 2002 (KR) ................................ 10-2002-0039369

(51) Int. Cl.[7] ................................................. G11C 7/00
(52) U.S. Cl. ........................ 365/203; 365/205; 365/208
(58) Field of Search ................................ 365/203, 205, 365/207, 208, 210

(56) References Cited

U.S. PATENT DOCUMENTS

| 5,138,579 | A | * | 8/1992 | Tatsumi et al. | ........ | 365/185.25 |
| 5,258,959 | A | * | 11/1993 | Dallabora et al. | ..... | 365/185.21 |
| 5,559,737 | A | * | 9/1996 | Tanaka et al. | ......... | 365/185.25 |
| 5,886,925 | A | * | 3/1999 | Campardo et al. | ..... | 365/185.21 |
| 6,628,548 | B1 | * | 9/2003 | Hsu et al. | .............. | 365/185.21 |

* cited by examiner

*Primary Examiner*—Son Mai
(74) *Attorney, Agent, or Firm*—Mayer, Brown, Rowe & Maw LLP

(57) ABSTRACT

Disclosed is a sense amplifier. The sense amplifier comprises a sensing unit for sensing data stored at a memory cell, a reference voltage generator having a reference cell, for generating a reference voltage, an equalizer that makes same the output of the sensing unit and the output of the reference voltage generator, before a word line of the memory cell is enabled, and is then disabled, and a comparator for comparing the output of the sensing unit and the output of the reference voltage generator. Therefore, the present invention can improve the sensing speed.

4 Claims, 6 Drawing Sheets

SENSE AMPLIFIER

BACKGROUND OF THE INVENTION

1. Field of the Invention

The present invention relates to a sense amplifier, and more particularly, to a sense amplifier having an equalizer.

2. Background of the Related Art

In general, data stored at the memory cell are read out by means of a sense amplifier. Referring to FIG. 1, the operation of the conventional sense amplifier used in NOR type flash memories will be described.

A plurality of sense blocks 30 are connected to the bit lines (not shown), respectively. The sense amplifier 30 includes a sensing unit 10 for sensing data of the memory cell. The output SAIN of the sensing unit 10 is inputted to a non-inverting + terminal of a comparator SAO. The output SAINR of a reference voltage generator 20 having a reference cell is inputted to an inverting − terminal of the comparator SAO. For example, if the output SAIN of the sensing unit 10 is higher than the output SAINR of the reference voltage generator 20, the comparator SAO outputs a Low signal. On the contrary, if the output SAIN of the sensing unit 10 is lower than the output SAINR of the reference voltage generator 20, the comparator SAO output a High signal. In other words, if the memory cell is a program cell, the comparator SAO outputs a Low signal since the threshold voltage of the reference cell is lower than the threshold voltage of the memory cell. Meanwhile, if the memory cell is an erase cell, the comparator SAO outputs a High signal since the threshold voltage of the reference cell is higher than the threshold voltage of the memory cell.

FIG. 2 is a detailed circuit diagram of the sense amplifier shown in FIG. 1.

If a word line W/L is enabled and a bit line select signal YSEL and a program bar signal PGMb becomes a High level, transistors N7 and N6 are turned on. Also, if the sense enable bar signal SAENb is a Low level, a transistor P1 is turned on. For example, if the memory cell is a program cell, a transistor N5 is turned off since the output of an inverter INV3 becomes a Low level. Accordingly, as the power supply is outputted via the transistors P1 and N4, the output of the sensing unit 10 becomes a High level. The output of the comparator SAO is outputted via the inverters INV1 and INV2.

Meanwhile, if the word line W/L is enabled, a reference bit line select signal RYSEL becomes a High level and the reference program bar signal RPGMb becomes a High level, the transistors N2 and N3 are turned on. Also, if the sense enable bar signal SAENb is a Low level, the transistor P0 is turned on. As the reference cell is a program cell, the output of the inverter INV0 becomes the Low level and the transistor N1 is thus turned off. Accordingly, voltages dropped at the transistors P0 and N0 are outputted SAINR.

For example, if the output of the sensing unit 10 is higher than the output SAINR of the reference voltage generator 20, the comparator SAO outputs a Low signal. On the contrary, if the output of the sensing unit 10 is lower than the output SAINR of the reference voltage generator 20, the comparator SAO outputs a High signal. In other words, if the memory cell is a program cell, the comparator SAO outputs the Low signal since the threshold voltage of the reference cell is lower than the threshold voltage of the memory cell. If the memory cell is an erase cell, the comparator SAO outputs the High signal since the threshold voltage of the reference cell is higher than the threshold voltage of the memory cell. At this time, the output of the comparator SAO is outputted via the inverters INV1 and INV2.

The above operation of the sense amplifier is well illustrated in the timing diagram of FIG. 3. If an address transition signal ATD occurs as a result of sensing variations in the address during the periods T0 and T1 of FIG. 3, a voltage for read the word line is generated and then applied to the word lines. As it is required that a high word line voltage be generated at a low voltage operation, the word line voltage starts to increase with delayed time. However, the sense amplifier will be enabled at T1 if transition of the address occurs. As the word line voltage is not sufficiently raised, however, the outputs SAIN and SAINR are increased up to the T2 period. After this time period, as the reference cell is turned on and current thus flows, an adequate sensing operation occurs at T3 period. At this time, the output SAINR is rapidly increased since the load of the output SAINR is relatively lower than that of the output SAIN. Accordingly, time delay occurs until the sensing data is outputted after the word line turned on the memory cell and the reference cell. In other words, time when the output SAINR drops to the reference voltage, for example in case of a program cell, time when the output SAIN is raised after the bit line is charged makes the sensing speed slow.

SUMMARY OF THE INVENTION

Accordingly, the present invention is contrived to substantially obviate one or more problems due to limitations and disadvantages of the related art, and an object of the present invention is to provide a sense amplifier capable of improving the sensing speed, by which the output of a reference voltage generator and the output of a sensing unit are made same before a reference cell and a memory cell are turned on, and the sensing operation is then performed.

The sense amplifier according to the present invention is characterized in that it comprises a sensing unit for sensing data stored at a memory cell, a reference voltage generator having a reference cell, for generating a reference voltage, an equalizer that makes same the output of the sensing unit and the output of the reference voltage generator, before a word line of the memory cell is enabled, and is then disabled, and a comparator for comparing the output of the sensing unit and the output of the reference voltage generator.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
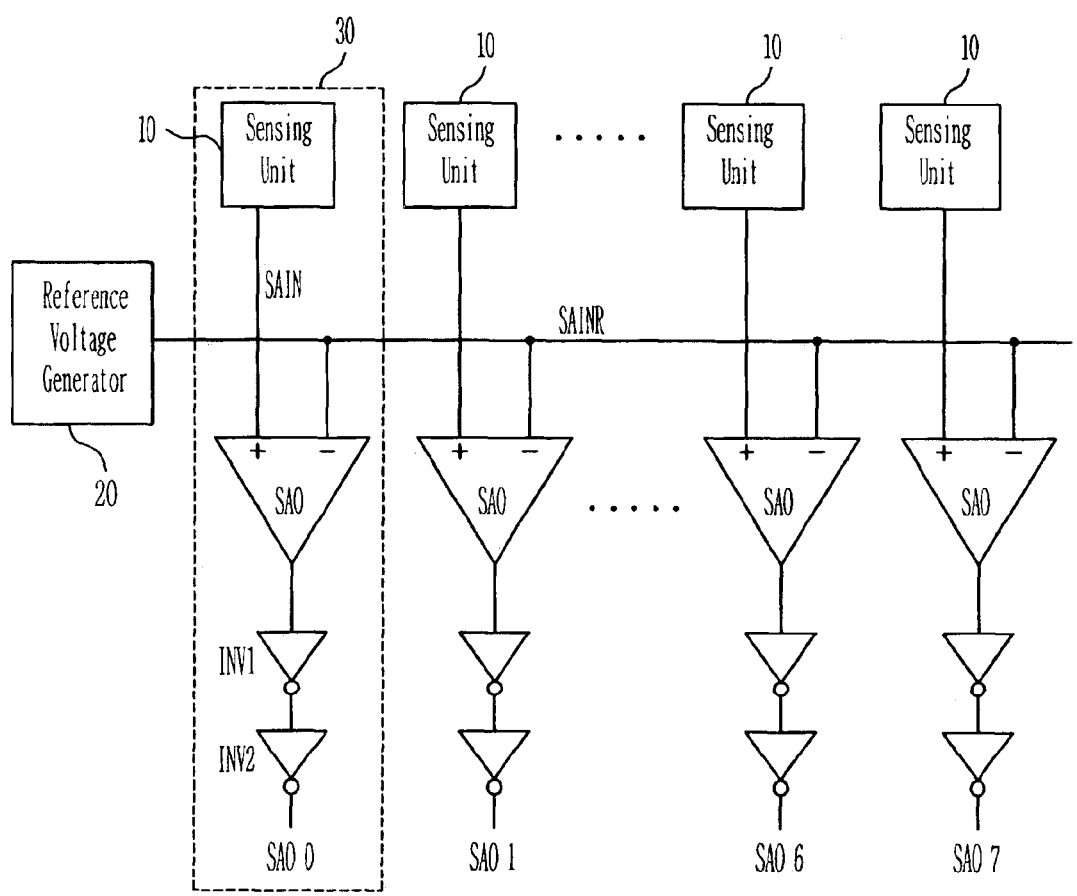
FIG. 1 illustrates a conventional sense amplifier.
Figure 2:
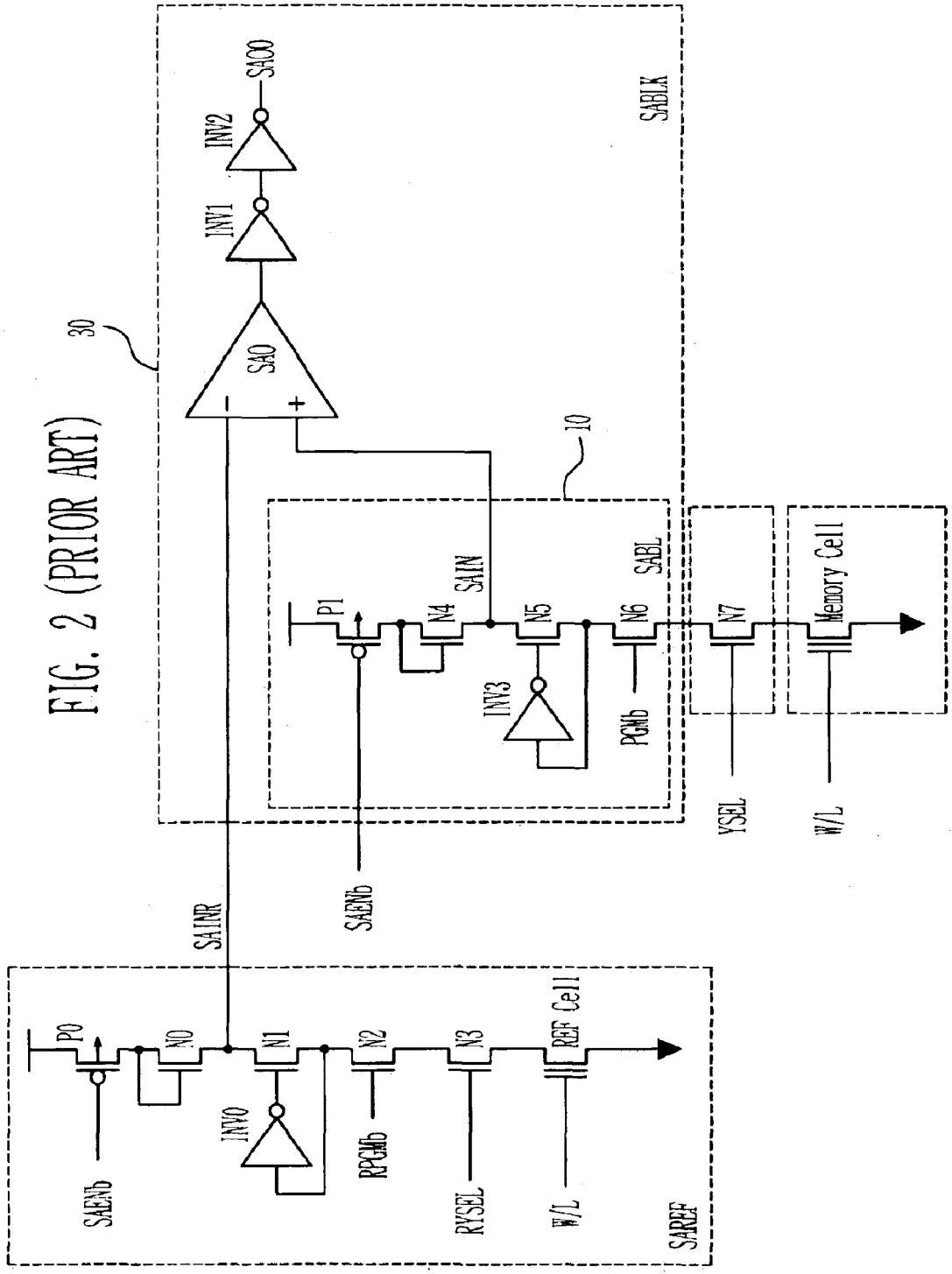
FIG. 2 is a detailed circuit diagram of the sense amplifier shown in FIG. 1.
Figure 3:
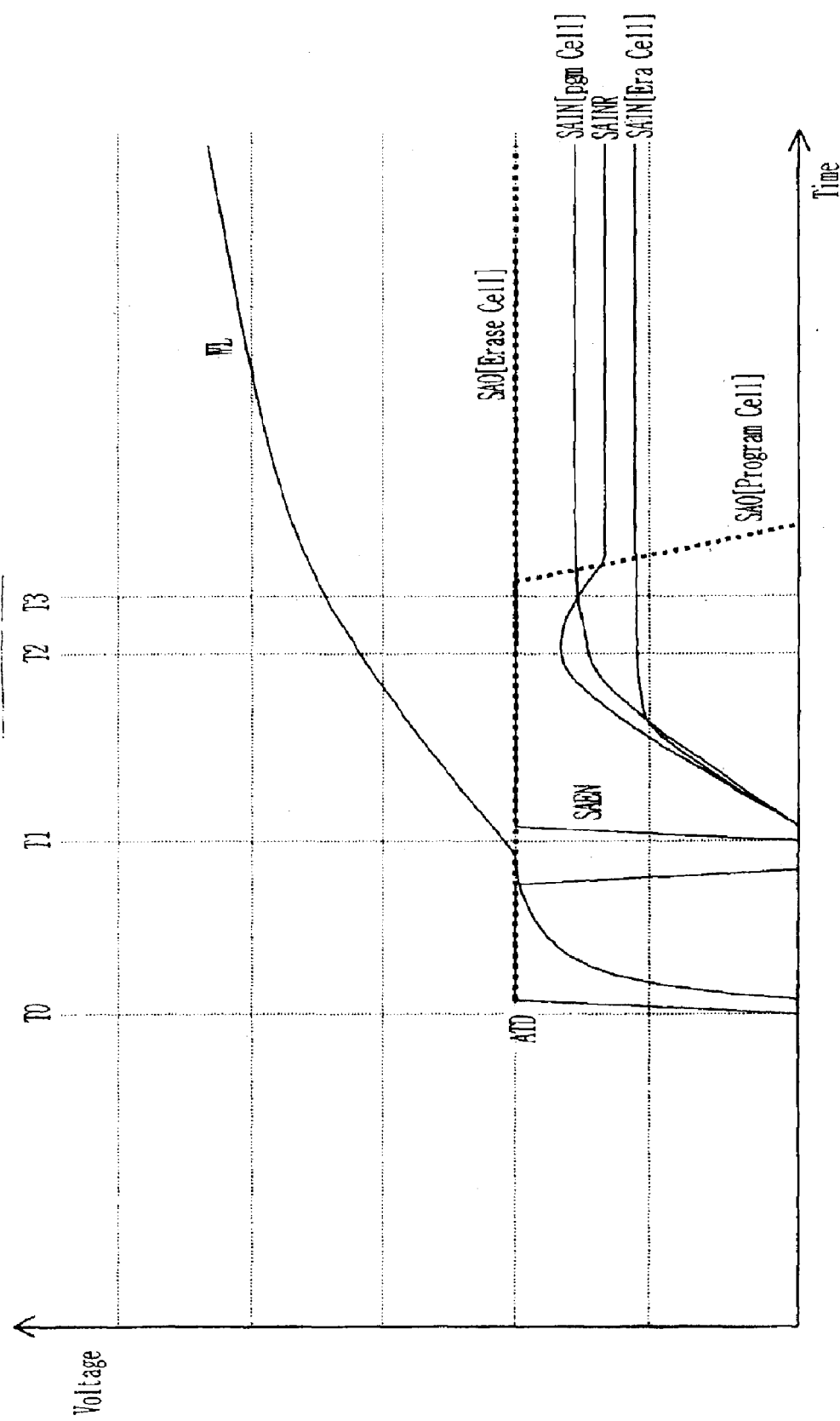
FIG. 3 is a timing diagram for explaining the operation of the sense amplifier shown in FIG. 2.

Reference will now be made in detail to the preferred embodiments of the present invention, examples of which are illustrated in the accompanying drawings, in which like reference numerals are used to identify the same or similar parts.

Figure 4:
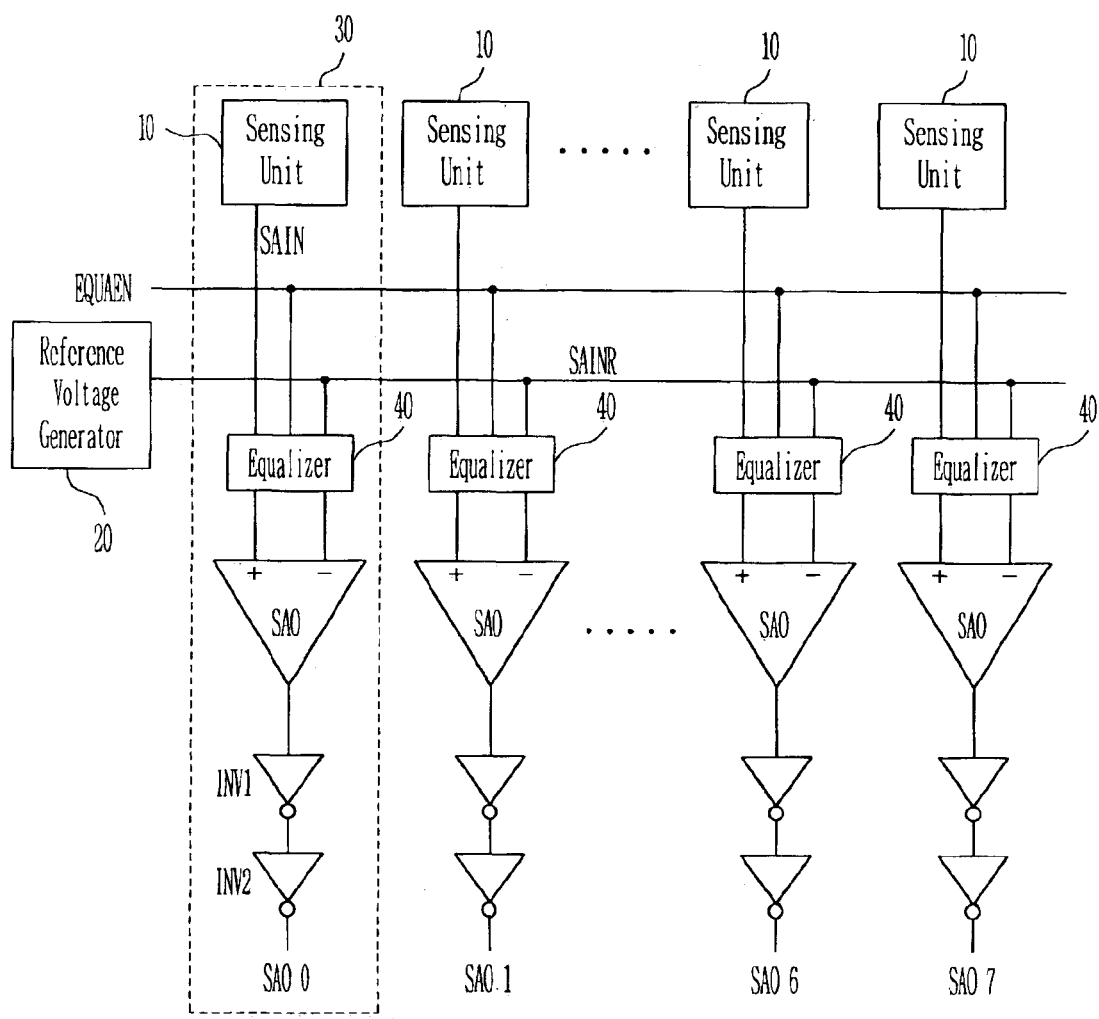
FIG. 4 illustrates a sense amplifier according to the present invention.

FIG. 4 illustrates a sense amplifier according to the present invention.

Referring to FIG. 4, it can be seen that the sense amplifier of the present invention has the same construction to the conventional sense amplifier shown in FIG. 1, except that the sense amplifier comprises an equalizer 40 provided between the output of the reference voltage generator and the output of the sensing unit and the equalizer 40 is also enabled by an equalizer enable signal EQUAEN.

How the sense amplifier of the present invention is operated will be below described in detail.

The equalizer 40 is enabled by the equalizer enable signal EQUAEN before a read voltage is applied to the word line (not shown), in order to make same the output SAIN of the sensing unit 10 and the output SAINR of the reference voltage generator 20. Thereafter, if the word line is enabled, the output SAIN of the sensing unit 10 is inputted to the non-inverting + terminal of the comparator SAO. The output SAINR of the reference voltage generator 20 having the reference cell is also inputted to the inverting − terminal of the comparator SAO. For example, if the output of the sensing unit 10 is higher than the output SAINR of the reference voltage generator 20, the comparator SAO outputs a Low signal. On the contrary, if the output of the sensing unit 10 is lower than the output SAINR of the reference voltage generator 20, the comparator SAO outputs a High signal. In other words, if the memory cell is a program cell, the comparator SAO outputs the Low signal since the threshold voltage of the reference cell is lower than the threshold voltage of the memory cell. On the contrary, if the memory cell is an erase cell, the comparator SAO outputs the High signal since the threshold voltage of the reference cell is higher than the threshold voltage of the memory cell.

Figure 5:
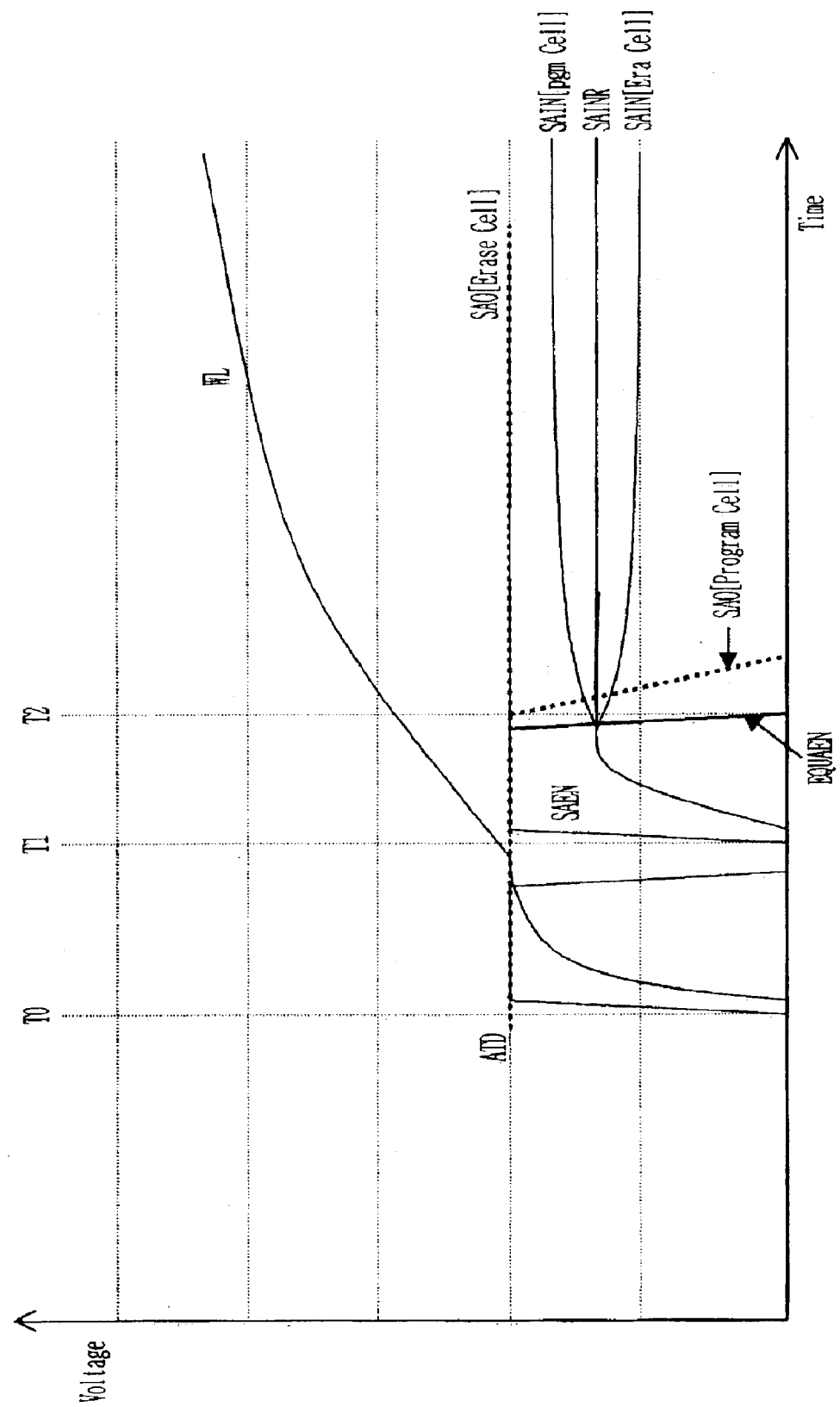
FIG. 5 is a timing diagram for explaining the operation of the sense amplifier shown in FIG. 4, and FIG. 6A through FIG. 6C are embodiments of the equalizer shown in FIG. 4.

The above operation of the sense amplifier is well illustrated in the timing diagram of FIG. 5.

As can be seen from FIG. 5, the equalizer 40 is driven at T1 and T2 periods and the outputs SAIN and SAINR are raised with the same voltage. Further, if the equalizer is disabled at T2, the outputs SAIN and SAINR have a prescribed voltage, respectively, by means of the voltages of the word lines. If the memory cell is a program cell, the output SAIN is raised. If the memory cell is an erase cell, the output SAIN is dropped. If the difference in the voltage between the outputs SAIN and SAINR occurs, the sensing data is outputted from the comparator SAO. Accordingly, there is no time delay during T3 unlike from the existing sense amplifier. Due to this, it is possible to improve the sensing speed.

Figure 6A:
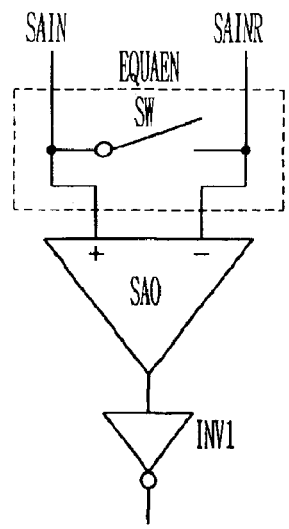
Figure 6B:
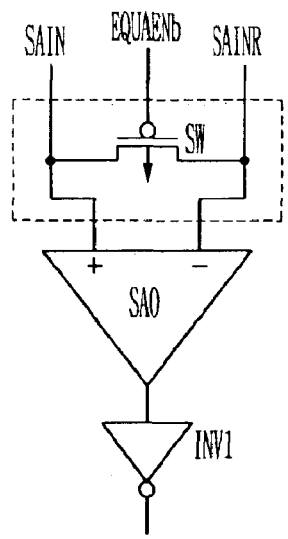
Figure 6C:
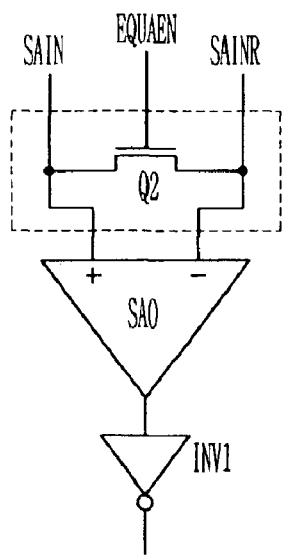

FIG. 6A through FIG. 6C are embodiments of the equalizer shown in FIG. 4.

FIG. 6A illustrates the equalizer that is constructed using a simple switch, FIG. 6B illustrates the equalizer that is constructed using a PMOS transistor Q1 and FIG. 6C illustrates the equalizer that is constructed using an NMOS transistor Q2.

As mentioned above, the present invention has an advantageous effect that it can improve the sensing speed by adopting the equalizer to the sense amplifier.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed are:

1. A sense amplifier, comprising:
   a sensing unit for sensing data stored at a memory cell;
   a reference voltage generator having a reference cell, for generating a reference voltage;
   an equalizer that makes same the output of the sensing unit and the output of the reference voltage generator, wherein the equalizer is enabled before applying a read voltage to a word line of the memory cell and disabled after applying the read voltage to the word line of the memory cell; and
   a comparator for comparing the output of the sensing unit and the output of the reference voltage generator.

2. The sense amplifier as claimed in claim 1, wherein the equalizer consists of a switch driven by an equalizer enable signal.

3. The sense amplifier as claimed in claim 1, wherein the equalizer consists of an PMOS transistor driven by the equalizer enable signal.

4. The sense amplifier as claimed in claim 1, wherein the equalizer consists of an NMOS transistor driven by the equalizer enable signal.

* * * * *